(12) United States Patent
Murakoshi et al.

(10) Patent No.: US 6,693,023 B2
(45) Date of Patent: Feb. 17, 2004

(54) ION IMPLANTATION METHOD AND ION IMPLANTATION EQUIPMENT

(75) Inventors: Atsushi Murakoshi, Kawasaki (JP); Kyoichi Suguro, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 2 days.

(21) Appl. No.: 10/079,490

(22) Filed: Feb. 22, 2002

(65) Prior Publication Data

US 2002/0130271 A1 Sep. 19, 2002

Related U.S. Application Data

(62) Division of application No. 09/510,240, filed on Feb. 22, 2000, now Pat. No. 6,403,452.

(30) Foreign Application Priority Data

Feb. 22, 1999 (JP) ............................................ 11-042730

(51) Int. Cl.⁷ .............................................. H01L 21/04
(52) U.S. Cl. ...................... 438/510; 438/514; 438/527; 438/506; 438/222; 438/458; 257/E21.001; 250/424
(58) Field of Search ................................ 438/510, 514, 438/522, 506, 475, 477, 458; 257/E21.001; 700/121; 250/424

(56) References Cited

U.S. PATENT DOCUMENTS

| 5,091,655 A | 2/1992 | Dykstra et al. | |
| 5,354,698 A | 10/1994 | Cathey, Jr. | |
| 5,656,859 A | 8/1997 | Murakoshi et al. | |
| 6,013,563 A | * 1/2000 | Henley et al. | ............... 438/458 |
| 6,055,460 A | * 4/2000 | Shopbell | .................... 700/121 |

FOREIGN PATENT DOCUMENTS

| EP | 0473097 A2 | | 3/1992 | |
| GB | 2 099 210 | | 12/1982 | |
| GB | 2 307 095 A | | 5/1997 | |
| GB | 2356736 A | * | 5/2001 | ......... H01L/21/265 |
| JP | 53072452 | | 6/1978 | |
| JP | 530072452 | * | 6/1978 | ........... H01L/21/26 |
| JP | 4323820 | | 11/1992 | |
| JP | 040323820 | * | 11/1992 | ......... H01L/21/265 |
| JP | 94-006193 | | 3/1994 | |
| JP | 7-326319 | | 12/1995 | |
| WO | 99/08306 | | 2/1999 | |

OTHER PUBLICATIONS

Search Report dated Mar. 21, 1001, application No. GB 0104488.2.
Combined Search and Examination Report under §17 & 18(3), dated Mar. 22, 2001, application No. GB 0104488.2.
S. Wolf, Silicon Processing for the VLSI Era, Jan. 1986, Lattice Press, vol. 1, pp. 308–311.

* cited by examiner

Primary Examiner—Matthew Smith
Assistant Examiner—Belur Keshavan
(74) Attorney, Agent, or Firm—Finnegan, Henderson, Farabow, Garrett & Dunner, L.L.P.

(57) ABSTRACT

In an ion implantation method using an ion implantation equipment having an extraction electrode and a post accelerator, ion is uniformly implanted into a shallow region from the surface of a sample by setting an applied volt. of the post accelerator higher than an applied volt. of the extraction electrode.

4 Claims, 3 Drawing Sheets

ION IMPLANTATION METHOD AND ION IMPLANTATION EQUIPMENT

This is a divisional of application Ser. No. 09/510,240, filed Feb. 22, 2000, now U.S. Pat. No. 6,403,452 which is incorporated herein by reference.

CROSS-REFERENCE TO RELATED APPLICATION

This application is based upon and claims the benefit of priority from the prior Japanese Patent Application No. 11-042730, filed Feb. 2, 1999, the entire contents of which are incorporated herein by reference.

BACKGROUND OF THE INVENTION

This invention relates to an ion implantation method and ion implantation equipment.

An ion implantation method is known as a method for doping impurity atoms into a semiconductor substrate. Since the concentration and depth of impurity atoms to be doped into a target region can be controlled with high precision, the ion implantation method becomes an important technique for manufacturing semiconductor devices in the present day.

As one of the conventional ion implantation equipments, there is provided an ion implantation equipment which has an extraction electrode 2 for introducing plural types of ions generated in an ion source chamber into a mass spectrograph while accelerating them and a post accelerator 5 for accelerating ions having a desired mass subjected to mass spectrometry in the mass spectrograph and taken out through a slit to final acceleration.

The acceleration voltage is controlled by acceleration by the extraction electrode and acceleration by the post accelerator. For example, if ion is implanted into a sample by use of the acceleration voltage of 120 keV, the acceleration voltage control operation is effected according to a combination of "maximum acceleration by the extraction electrode"+"acceleration by the post accelerator".

The acceleration by the post accelerator only assists in an insufficient portion which cannot be attained by the maximum acceleration by the extraction electrode and the acceleration by the post accelerator is lower than the maximum acceleration by the extraction electrode. The reason why the maximum acceleration by the extraction electrode is made higher is to enhance the throughput in the implantation step by efficiently transporting an ion beam and stably acquire a constant amount of ion beam current.

Further, if ion is applied to a sample by use of the acceleration voltage of 5 keV, only the acceleration by the extraction electrode is used or an "acceleration by the extraction electrode×deceleration by the port accelerator" method, that is, an acceleration×deceleration (accel×decel) method, is used.

BRIEF SUMMARY OF THE INVENTION

An object of this invention is to provide an ion implantation method capable of uniformly implanting ions into a sample by use of an ion implantation equipment having a first electrode (extraction electrode) and a second electrode (post accelerator).

In order to attain the above object, in an ion implantation method using an ion implantation equipment having a container for generating plural types of ions therein, a first electrode for extracting the plural types of ions from the container, a selector section for selecting at least one desired type of ion from the plural types of ions, and a second electrode for accelerating the desired type of ion, an ion implantation method according to this invention has a feature that an applied volt. of the second electrode is set higher than an applied volt. of the first electrode.

In this invention, it is preferable to attain the relation of $\rho \geq Dmax/2$ if the maximum current density in the ion beam formed of ions accelerated by the second electrode is Dmax, the amount of current of the ion beam is I, the width of the ion beam is W, and the average current density expressed by $I/W^2$ is $\rho$. In this case, the width of the ion beam is the width on the surface of the sample into which ion is implanted.

According to the study of the inventor of this application and the like, in an ion implantation method using an ion implantation equipment having a container for generating plural types of ions therein, a first electrode for extracting the plural types of ions from the container, a selector section for selecting at least one desired type of ion from the plural types of ions, and a second electrode for accelerating the desired type of ion, it is proved that ion can be uniformly implanted into the sample if an applied volt. of the second electrode is set higher than an applied volt. of the first electrode. Particularly, it is proved that the above effect can be further enhanced when the relation of $\rho \geq Dmax/2$ is set up if the maximum current density in the ion beam formed of ions accelerated by the second electrode is Dmax, the amount of current of the ion beam is I, the width of the ion beam is W, and the average current density expressed by $I/W^2$ is $\rho$. Therefore, according to this invention, it is possible to uniformly implant ion into the sample.

Another object of this invention is to provide an ion implantation equipment capable of suppressing a lowering in the ion implantation amount and the concentration of active ion.

In order to attain the above object, an ion implantation equipment according to this invention comprises an ion implantation equipment main body for implanting desired type of ion into a sample; an oxide film removing device connected to the ion implantation equipment main body, for removing an oxide film formed on the surface of the sample; and an oxide film removing device for removing an oxide film formed on the surface of the sample prior to implantation of the accelerated ion into the sample.

In this invention, as an example of the concrete construction of the oxide film removing device, a cleaning chamber for removing the oxide film formed on the surface of the sample before implanting the accelerated ion into the sample, a drying chamber for drying the sample cleaned in the cleaning chamber, a transferring section for transferring the sample into the sample chamber, cleaning chamber and drying chamber, and a pressure control section for controlling the pressures in the sample chamber, cleaning chamber and drying chamber are provided.

The pressures in the sample chamber, cleaning chamber and drying chamber are controlled to reduced pressure (lower than one atmospheric pressure), preferably 5 Torr or less, and more preferably, 0.1 Torr or less by the pressure control section.

The ion implantation equipment according to this invention may include a first electrode (extraction electrode) and second electrode (post accelerator) or it may include only a second electrode (post accelerator).

The oxide film formed on the surface of the sample may be an important factor for causing the ion implantation amount of the concentration of active ion to be made lower than expected if ion is implanted into the sample surface, particularly, if ion is implanted into a shallow region as viewed from the surface of the substrate, more specifically, if ion is implanted into a shallow region of 50 nm or less from the surface of the sample.

Therefore, according to this invention, since it becomes possible to set up a state in which no oxide film is re-formed on the surface of the sample in a period from removal of the oxide film to the end of the ion implantation by connecting the oxide film removing device for removing the oxide film formed on the surface of the sample to the sample chamber, an ion implantation equipment capable of suppressing a lowering in the ion implantation amount and the concentration of active ion can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First, the problem of the conventional ion implantation method or equipment is explained. If the conventional acceleration voltage control method is used, it is difficult to uniformly implant ion into the sample. This is due to the conventional acceleration voltage control method, a control method which gives much importance to the way of efficiently transporting the ion beam.

Further, if ion is implanted into a shallow region from the surface of the sample, the ion implantation amount and the concentration of active ion are lowered and it is difficult to form a shallow diffusion layer having an impurity concentration as designed.

Embodiments of this invention for solving the above problem are explained below with reference to the accompanying drawings.

(First Embodiment)

Figure 1:
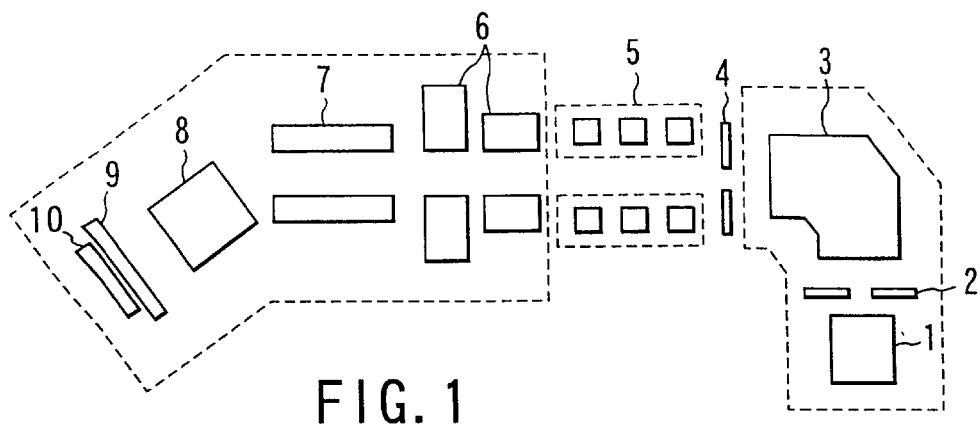
FIG. 1 is a schematic view showing an ion implantation equipment used in an ion implantation method according to a first embodiment of this invention.

FIG. 1. is a schematic view showing an ion implantation equipment used in an ion implantation method according to a first embodiment of this invention.

In FIG. 1, a reference numeral 1 denotes an ion source chamber for generating plural types of ions therein and the plural types of ions generated in the ion source chamber 1 are extracted to the exterior of the ion source chamber 1 while accelerated by an extraction electrode 2 and then subjected to mass spectrometry in a mass spectrograph 3 formed of a separation electromagnet.

In this case, the extraction electrode 2 extracts ions from the ion source chamber 1 and may accelerate the thus extracted ions.

Then, only desired type of ion among the plural types of ions subjected to mass spectrometry in the mass spectrograph 3 is taken out by use of a slit 4 and the desired type of ion is accelerated to final acceleration by a post accelerator 5 formed of an acceleration electrode, thus making an ion beam of desired type of ion.

The ion beam is applied to a sample 9 such as a wafer or substrate while it is scanned in the X and Y directions by four-pole lenses 6, 7 so as to make the implantation amount uniform. In FIG. 1, a reference numeral 8 denotes a Faraday cup and 10 denotes a wafer holder.

With the above ion implantation equipment, ion which is actually implanted is controlled by adjustment of the current amount of the ion beam by the ion source chamber 1, adjustment of the spreading (width) of the ion beam by the extraction electrode 2, selection adjustment of ion by the separation electromagnet 3 and slit 4, adjustment of the acceleration voltage by the extraction electrode 2 and post accelerator 5, and adjustment of the implantation angle by the four-pole lenses 6, 7.

The feature of the ion implantation method of this embodiment is that an applied volt. of the post accelerator 5 is set higher than an applied volt. of the extraction electrode 2 unlike the conventional method. For example, if ion is implanted into the sample 9 by use of the acceleration voltage 200 keV, the maximum acceleration voltage by the extraction electrode 2 is 50 keV and the maximum acceleration voltage by the post accelerator 5 is 150 keV.

The maximum acceleration voltage by the extraction electrode 2 can be set higher than 100 keV (=200 keV/2) and, for example, it can be set up to 130 keV. Conventionally, in order to enhance the throughput, for example, the maximum acceleration voltage by the extraction electrode 2 is set to 130 keV in the case of the above example.

That is, in this invention, the applied volt. of the post accelerator 5 is set higher than the applied volt. of the extraction electrode 2 in a case where the maximum acceleration energy of desired type of ion obtained by the extraction electrode 2 is larger than half of the desired acceleration energy or it is outside the range of the performance of the extraction electrode 2 when desired type of ion is implanted into the sample with desired acceleration energy.

The ion implantation method of this embodiment is explained in detail below. First, $BF_3$ gas is introduced into the ion source chamber 1 to generate plural types of ions by arc discharging. Then, the plural types of ions are taken out by the extraction electrode 2 and subjected to mass separation by the separation electromagnet 3 to extract only $^{11}B^+$ ion via the slit 4.

After this, $^{11}B^+$ ion is accelerated to the final energy by the post accelerator 5 to form an ion beam. The ion beam is scanned in the X and Y directions by the four-pole lenses 6, 7, converged to have a convergent point on the surface of the sample 9 and the above scanning operation is effected while the wafer holder 8 is being rotated so as to uniformly apply the ion beam to the surface of the sample 9. At this time, the sample 9 is inclined by the wafer holder 10 so that the incident angle of the ion beam will be 7 degrees.

With the above method, $^{11}B^+$ ion was implanted into the sample with the acceleration voltage of 80 keV and dose amount of $5\times10^{15}$ $cm^{-2}$. In the case of the above acceleration voltage, since acceleration only by the extraction electrode 2 is not enough, it is necessary to accelerate ion by use of the post accelerator 5.

Distribution of the acceleration voltage in the conventional case is made such that the acceleration voltage of the extraction electrode 2 is set higher than the acceleration voltage of the post accelerator 5 and, for example, the acceleration voltage of the extraction electrode 2 is set at 50 keV and the acceleration voltage of the post accelerator 5 is set at 30 keV.

The inventor of this application and others implanted ion in three conditions that the ion beam current was set at 4 mA, 8 mA and 12 mA with distribution of the acceleration voltage of the conventional method. The ion beam current amount can be obtained as required by changing the condition of arc discharging in the ion source chamber 1 (including a change of the gap interval between the ion source chamber 1 and the extraction electrode 2). Assume that the sample in which the ion beam current amount is 4 mA is S1, the sample in which the ion beam current amount is 8 mA is S2 and the sample in which the ion beam current amount is 12 mA is S3. Each of the samples S1 to S3 is an 8-inch wafer.

The damage amount immediately after implantation is quantitatively expressed by use of a Therma Wave method for the respective samples into which ion is implanted under the above conditions. The Therma Wave method is a method for applying infrared rays to the sample and converting lattice vibration which is different from the normal lattice vibration and which occurs if crystal defects formed by the ion implantation are present into a numerical value according to the reflection intensity of infrared rays when the infrared rays are reflected.

Next, the samples S1, S2, S3 which had been subjected to the ion implantation were subjected to the heat treatment for one hour at 900° C. in a nitrogen atmosphere, the sheet resistance measurement was made at 130 points on the sample surface by the four-terminal method, and the average value and 1σ were derived. The result of measurement is shown in TABLE 1.

TABLE 1

Dependency of Uniformity of Implantation on Beam Current

| Wafer No. | Beam Current | Therma Wave (Signal Units) | Therma Wave (%) | ρs (Ω/□) | ρs(1σ) (%) |
|---|---|---|---|---|---|
| S-01a | 4 mA | 6069 | 1.52 | 39.78 | 0.442 |
| S-01b | " | 6089 | 1.81 | 39.47 | 0.347 |
| S-01c | " | 6026 | 1.54 | 39.07 | 0.303 |
| S-02a | 8 mA | 6453 | 2.98 | 39.31 | 0.675 |
| S-02b | " | 6638 | 1.54 | 39.25 | 0.421 |
| S-02c | " | 6395 | 2.72 | 38.74 | 0.546 |
| S-03a | 12 mA | 7369 | 5.74 | 39.28 | 0.772 |
| S-03b | " | 7580 | 7.26 | 39.09 | 0.835 |
| S-03c | " | 7424 | 4.84 | 38.73 | 0.834 |

As is seen from TABLE 1, since the sheet resistance after the heat treatment is substantially set at 39 Ω/□ irrespective of the ion beam current amount, it is understood that almost no implantation error due to a difference in the ion beam current amount is present.

On the other hand, if attention is paid to the value of 1σ indicating the in-plane uniformity, it is understood that the average value of the ion beam current is smaller and the variation thereof is smaller as the ion beam current amount becomes smaller. It is understood that almost 0.814% is obtained in the case of implantation of 12 mA and a variation in the sheet resistance is 0.364% and becomes smaller than half of the above value when the ion beam current amount is set to 4 mA, that is, ⅓ of the above value.

It is understood that the value of the signal of Therma Wave immediately after ion implantation is smaller and the implantation damage amount by ion implantation is smaller as the ion beam current amount becomes smaller.

Thus, it is understood that uniformity of implantation can be made high and the implantation damage can be alleviated by lowering the ion beam current.

However, it is predicted that the ion beam width may be changed by a lowering in the beam current. Therefore, the inventor of this application and others checked an influence by a change in the ion beam width.

In this case, $^{11}B^+$ used in the former implanting condition was implanted in a condition of the acceleration voltage 80 keV, dose amount $5 \times 10^{15}$ cm$^{-2}$ and ion beam current amount 8 mA.

The intensity of arc discharging in the ion source chamber 1 was fixed and the applied volt. (extraction voltage) of the extraction electrode 2 was set at 50 keV and the acceleration voltage (post acceleration voltage) of the post accelerator 5 was set at 30 keV for samples S4, S5, S6 like the conventional method (acceleration/deceleration method). Further, the gap interval between the mass separator 3 and the slit 4 in FIG. 1 was changed to change the ion beam width.

Further, the extraction voltage was set at 40 keV and the post acceleration voltage was set at 40 keV for a sample S7. The extraction voltage was set at 30 keV and the post acceleration voltage was set at 50 keV for a sample S8. The extraction voltage was set at 20 keV and the post acceleration voltage was set at 60 keV for a sample S9 and thus the extraction voltage was lowered and the acceleration voltage was raised so as to change the ion beam width. The gap interval between the mass separator 3 and the slit 4 for the samples S7, S8, S9 was fixed at 87 mm.

The result of ion implantation effected for the samples S4 to S9 is shown in TABLE 2.

TABLE 2

Dependency of Uniformity of Implantation on Post Acceleration Voltage

| Wafer No. | Acceleration Voltage (pre-stage + post-stage) | Post-stage gap (mm) | Beam Width (half/peak) | Therma Wave (%) | ρs (Ω/□) | ρs (%) | Therma Wave (After Anneal) |
|---|---|---|---|---|---|---|---|
| A-01 | 50 keV + 30 keV | 87 | 45 mm/31 mm | 4.88% | 42.73 | 1.274 | 0.77% |
| B-01 | " | 50 | 44 mm/27 mm | 5.03% | 42.33 | 1.205 | 0.80% |
| V-01 | " | 15 | 38 mm/32 mm | 5.11% | 42.75 | 1.307 | 0.73% |
| D-01 | 40 keV + 40 keV | 87 | 49 mm/22 mm | 4.44% | 42.29 | 1.078 | 0.46% |
| E-01 | 30 keV + 50 keV | 87 | 43 mm/22 mm | 4.39% | 42.94 | 1.088 | 0.43% |
| F-01 | 20 keV + 60 keV | 87 | 25 mm/25 mm | 3.99% | 42.98 | 0.953 | 0.38% |

Figure 2:
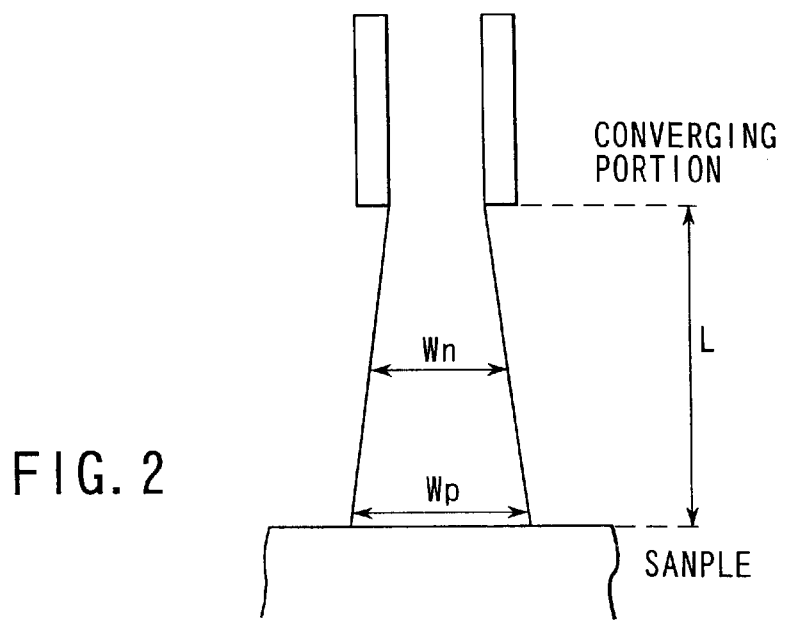
FIG. 2 is a view for explaining the definition of the width of an ion beam.

A change in the ion beam width (half/peak) can be observed although it is small in a case where the extraction voltage is set at 50 keV and the post acceleration voltage is set at 30 keV as in the conventional method and the gap (post-stage gap) between the separation electromagnet 3 and the slit 4 is changed. The ion beam width is defined as follows. That is, as shown in FIG. 2, if a distance between the sample and one of mechanisms (converging portion) which has a function of converging the ion beam and is closest to the sample is set to L, the ion beam width is defined as a value (Wh/Wp) obtained by dividing the beam width wh in a position separated from the sample by L/2 by the beam width Wp in a position separated from the sample by L/10. The converging portion is the four-pole lens and polarizing lens, for example.

If attention is paid to a variation in the sheet resistance, no significant change is observed. Therefore, it is understood that it does not almost contribute to convergence of the ion beam before it enters the post accelerator 5.

If the extraction voltage is lowered and the post acceleration voltage is raised, the ion beam width is changed to a large extent and the ion beam width becomes smaller as an increase in the post acceleration voltage and thus it is understood that the ion beam converging effect becomes large.

Further, in the measurement of Therma Wave after ion implantation, the value becomes smaller as the post acceleration voltage is higher and it is understood that the amount of damage is changed. In addition, it is understood that a variation in the sheet resistance after the heat treatment becomes smaller as an increase in the post acceleration voltage.

Figure 3:
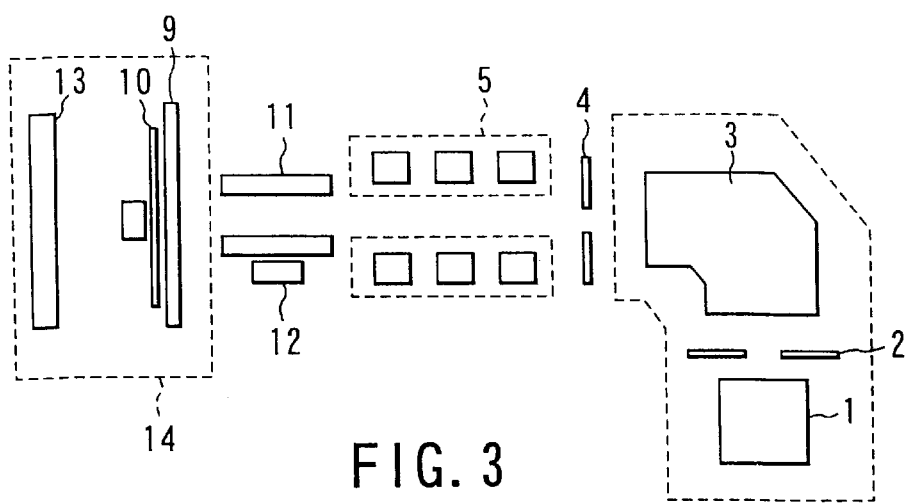
FIG. 3 is a schematic view showing an ion implantation equipment used for checking an influence on the current density in the ion beam.

In the conventional case in which the extraction voltage is 50 keV and the post acceleration voltage is 30 keV, an in-plane variation in the sheet resistance is 0.77%, and it is understood that an in-plane variation in the sheet resistance becomes 0.38% and is reduced to approx. ½ of the conventional case when the extraction voltage is set at 20 keV and the post acceleration voltage is set at 60 keV to increase the ratio of post acceleration voltage/extraction voltage.

voltage by the extraction electrode 2 and the maximum voltage by the post accelerator 5 are the same as those of the ion implantation equipment shown in FIG. 1. Portions of FIG. 3 that correspond to those of FIG. 1 are denoted by the same reference numerals. In FIG. 3, a reference numeral 11 denotes a polarizing lens, 12 denotes a plasma shower, 13 denotes a beam stop (profiler) and 14 denotes a sample chamber. The plasma shower 12 is used for neutralizing electrification of the sample by implanted ion by applying charged particles having charges opposite to those of the implanted ion to the sample and preventing dielectric breakdown of an insulating film formed on the sample, for example.

The method for implanting $^{11}B^+$ ion by use of the ion implantation equipment is the same as that for implanting $^{11}B^+$ ion by use of the ion implantation equipment shown in FIG. 1. In this case, however, a gap interval between the slit 4 and the post accelerator 5 is adjusted so that the maximum current density of the ion beam may be set to 0.05 mA/cm$^2$.

For a sample S10, only the extraction voltage of 5 keV was used as the acceleration voltage, the ion beam current was set to 2 mA, and the beam width of approx. 111 mm was obtained. For a sample S11, only the extraction voltage of 5 keV was used as the acceleration voltage, the ion beam current was set to 1 mA by changing the arc discharging in the ion source chamber 1, and the beam width of 97 mm was obtained. Further, for a sample S12, the extraction voltage was set at 3 keV, the post acceleration voltage was set at 2 keV, the ion beam current was set to 1 mA, and the beam width of 889 mm was obtained. For a sample S13, the extraction voltage was set at 2 keV, the post acceleration voltage was set at 3 keV, the ion beam current was set to 1 mA, and the beam width of 59 mm was obtained.

After the ion implantation, each sample was subjected to RTA of 900° C. for 30 seconds as the heat treatment to activate the implanted ions and the ion concentration was evaluated.

The result of evaluation of the samples S10 to S13 is shown in TABLE 3.

TABLE 3

Dependency of Uniformity of Implantation on Beam Width

| Wafer No. | Beam Current (mA) | Acceleration Voltage (pre-stage + post-stage) | Beam Width (mm) | Maximum Current Density (mA/cm$^2$) | Therma Wave (%) | ρs (Ω/□) | ρs (%) | Therma Wave (After Anneal) |
|---|---|---|---|---|---|---|---|---|
| S10 | 2 | 5 keV + 0 keV | 111 mm | 0.06 | 0.35% | 591.6 | 0.77% | 1.13% |
| S11 | 1 | 5 keV + 0 keV | 97 mm | 0.04 | 0.30% | 601.3 | 0.65% | 0.91% |
| S12 | 1 | 3 keV + 2 keV | 88 mm | 0.05 | 0.27% | 600.2 | 0.61% | 0.92% |
| S13 | 1 | 2 keV + 3 keV | 59 mm | 0.05 | 0.23% | 599.4 | 0.44% | 0.83% |

Thus, it is proved that the damage caused at the ion implantation time can be reduced and a variation in activation of impurity after the heat treatment can be made small by increasing the ratio of post acceleration voltage/ extraction voltage.

However, it is considered that the current density in the ion beam may contribute to a reduction in the variation since the ion beam width becomes smaller by increasing the post acceleration voltage in comparison with the extraction voltage.

FIG. 3 shows ion implantation equipment that may be used to implant $^{11}B^+$ ion in a condition of acceleration voltage 5 keV and dose amount 5×10$^{14}$ cm$^{-2}$. The maximum It is understood from TABLE 3 that the value of Therma Wave immediately after the ion implantation and the in-plane uniformity of the sheet resistance after the heat treatment are lowered by reducing the ion beam current or reducing the ion beam width in a case where the acceleration voltage of 5 keV is obtained only by use of the extraction electrode 2, but the improvement is not significant.

Further, it is understood from TABLE 3 that better results of Therma Wave after the ion implantation and the in-plane uniformity of the sheet resistance after the heat treatment are obtained by deriving the acceleration voltage of 5 keV by use of the extraction electrode 2 and post accelerator 5 and setting the applied volt. of the post accelerator 5 higher than the applied volt. of the extraction electrode 2 in comparison with the conventional case wherein acceleration is obtained only by use of the extraction electrode 2. However, it is understood that the results of Therma Wave and the in-plane uniformity of the sheet resistance after the heat treatment are not good in a case wherein the applied volt. of the post accelerator 5 is set lower than the applied volt. of the extraction electrode 2 as in the conventional method.

Further, it is understood from TABLE 3 that the in-plane variation in the sheet resistance is 0.65% if acceleration is made only by use of the extraction electrode 2 as in the conventional method, but the in-plane variation in the sheet resistance is 0.44% and can be reduced by approx. 25% in comparison with the conventional method if acceleration is made by distributing the acceleration voltage of 5 keV to apply 2 keV to the extraction electrode 2 and 3 keV to the post accelerator 5.

The above result indicates that a variation in the ion implantation can be changed according to at least the ion beam width.

From the above explanation, it is understood that the damage given to the sample after ion implantation can be made uniform and activation of ion in the heat treatment can be made uniform by setting the applied volt. of the post accelerator 5 higher than the applied volt. of the extraction electrode 2. It is considered that this is because the ion beam can be more easily converged by enhancing the acceleration rate of the post accelerator 5.

If attention is paid to the items of the spread width of the ion beam and ion beam current in TABLE 3, the spread width of the ion beam is 97 mm when the ion beam current is 1 mA in a case wherein acceleration is made only by use of the extraction electrode 2 as in the conventional method.

At this time, the maximum current density is 0.04 mA/cm$^2$, the average current density expressed by (ion current amount)/(beam spread width)$^2$ is 0.011 mA/cm$^2$ and thus the maximum current density is increased to approx. four times the average current density.

On the other hand, if acceleration is made by use of the extraction electrode 2 and post accelerator 5 and the applied volt. of the post accelerator 5 is set higher than the applied volt. of the extraction electrode 2 as in this embodiment, the ion beam spread width is 59 mm when the ion beam current is 1 mA.

At this time, the maximum current density is 0.05 mA/cm$^2$, the average current density expressed by (ion current amount)/(beam spread width)$^2$ is 0.029 mA/cm$^2$ and thus the maximum current density is increased to approx. 1.72 times the average current density. That is, it is understood that the ion beam is not an ion beam having the extremely high beam current density, but an ion beam which is relatively uniform can be formed.

It is considered that this is because creation of the spot can be controlled by adequately distributing the applied volt. and the convergence efficiency of the ion beam is enhanced and the implantation uniformity is improved by setting the applied volt. of the post accelerator 5 higher than the applied volt. of the extraction electrode 2.

In the above case, the maximum current density is approximately 1.72 times the average current density. But it is understood that an extremely uniform ion beam can be formed if it is equal to or less than twice the average current density.

Thus, it is well understood that the beam width is largely changed by distributing the applied volts of the extraction electrode 2 and post accelerator 5.

The explanation has been made in view of the hardware of the ion implantation equipment, but the explanation is made below in view of how to control the hardware. Generally, the control sequence of the ion implantation equipment is roughly made as follows (sequence 1 to sequence 12).

Sequence 1: introduction of gas of desired type of ion

Sequence 2: start of arc discharging (application of arc voltage, arc current ON)

Sequence 3: source magnet ON

Sequence 4: set current of mass separator for extracting the desired type of ion Sequence 5: set acceleration voltage lower than 90 keV→post acceleration: 0 keV equal to or higher than 90 keV→post acceleration: (total acceleration voltage−extraction voltage)

Sequence 6: adjustment of a gap distance between the extraction electrode and the ion source extraction port→the peak is taken at a distance at which the maximum beam current can be derived Sequence 7: adjustment of a distance in the lateral direction between the extraction electrode and the ion source extraction port→the peak is taken at a distance at which the maximum beam current can be derived Sequence 8: current adjustment of analyzer magnet→the peak is taken in a position in which the maximum beam current can be derived Sequence 9: adjustment of arc current Sequence 10: is desired type of ion beam current derived?

Yes→to Sequence 11

No→to Sequence 6

Sequence 11: measurement of beam profile

Sequence 12: end of adjustment

In the above conventional control sequence, it is impossible to control the maximum current density, beam width obtained in the beam profile measurement and the rate of the acceleration voltage.

Therefore, in this embodiment, the following control sequence is prepared.

Sequence 1: introduction of gas of desired type of ion

Sequence 2: start of arc discharging (application of arc voltage, arc current ON)

Sequence 3: source magnet ON

Sequence 4: mass separator, current ON

Sequence 5: setting of set acceleration voltage→extraction voltage=(set acceleration voltage/2)×40%

→post acceleration voltage=set acceleration voltage−extraction voltage

Sequence 6: adjustment of a gap distance between the extraction electrode and the ion source extraction port→the peak is taken at a distance at which the maximum beam current can be derived Sequence 7: adjustment of a distance in the lateral direction between the extraction electrode and the ion source extraction port→the peak is taken at a distance at which the maximum beam current can be derived Sequence 8: current adjustment of analyzer magnet→the peak is taken in a position in which the maximum beam current can be derived Sequence 9: adjustment of arc current Sequence 10: is desired type of ion beam current derived?

Yes→to Sequence 11

No→to Sequence 6

Sequence 11: measurement of beam profile (beam width, maximum current density)
  calculation of average current density=(beam current amount obtained in Sequence 10)/(beam width)$^2$
Sequence 12: is the maximum current density equal to or lower than twice the average current density?
  Yes→to Sequence 14
  No→to Sequence 13
Sequence 13: re-setting of set acceleration voltage
  →extraction voltage=(set acceleration voltage/2)×(40%+ (the number of re-setting operations)×5%)
  * the number of re-setting operations is set to 10 at maximum. If the result of Sequence 12 is "No" even in the tenth re-setting operation, the process is re-started from Sequence 1.
    →post acceleration voltage=set acceleration voltage−re-set extraction voltage
    →to Sequence 6 after re-setting
Sequence 14: end of adjustment Since the value of the set acceleration voltage is changed in the operation for setting the set acceleration voltage in Sequence 5 if the above control sequence is used, the ratio of the extraction voltage and the post acceleration voltage can be adjusted and the values of the ion beam width and maximum current density are changed, and thus the parameters thereof can be controlled. As a result, as is explained so far, the implantation uniformity can be enhanced and ion implantation can be made without causing a lowering in the implantation amount.

(Second Embodiment)

With the conventional ion implantation method, a sample is cleaned by use of a cleaning device which is different from and physically separated from the ion implantation equipment before ion implantation. However, even if a natural oxide film formed on the surface of the sample is removed, a natural oxide film is formed on the surface of the sample again since the sample is exposed to the atmosphere in a period from the end of the cleaning process to the start of the ion implantation process.

In this state, if ion implantation of boron is effected in a condition of the acceleration voltage 500 eV and dose amount $2\times10^{14}$ cm$^{-2}$, for example, the natural oxide film which is as thin as approx. 2 nm will give an influence to the sample.

In the case of boron ion implantation with the acceleration voltage 500 eV, the maximum concentration depth will be approx. 4 nm. However, if the maximum concentration depth in the ion implantation process is influenced by the natural oxide film formed on the surface of the sample, it will be set at the shallow region on the natural oxide film side, and therefore, part of boron which is originally intended to be implanted into the sample is taken into the natural oxide film.

As a result, boron is implanted into the sample with a dose amount less than a desired dose amount. Naturally, with a lowering in the energy of acceleration voltage, the implantation amount becomes smaller by the effect of sputtering and reflection of ion.

In the case of ion implantation of oxygen with the acceleration voltage 1 keV, the sputtering yield of silicon is approx. 0.2 with the tilt angle 0° and if it is assumed that substantially the same value of the sputtering yield is obtained for oxygen and boron, it is considered that removal of the sample occurring at the time of ion implantation is approx. 0.01 nm and a lowering in the ion implantation amount can be substantially neglected.

However, in practice, the count (actual measurement value) by SIMS is 1 to $15\times10^{14}$ cm$^{-2}$ and a lowering of ion implantation amount of 20% or more is observed although the set implantation amount is $2\times10^{14}$ cm$^{-2}$. This indicates that it is influenced not only by sputtering and reflection at the time of ion implantation but also by the natural oxide film formed on the surface of the sample.

Therefore, the same ion implantation process is effected so as not to form a natural oxide film in a period from the end of the cleaning process to the ion implantation process and then a lowering in the ion implantation amount is checked.

Figure 4:
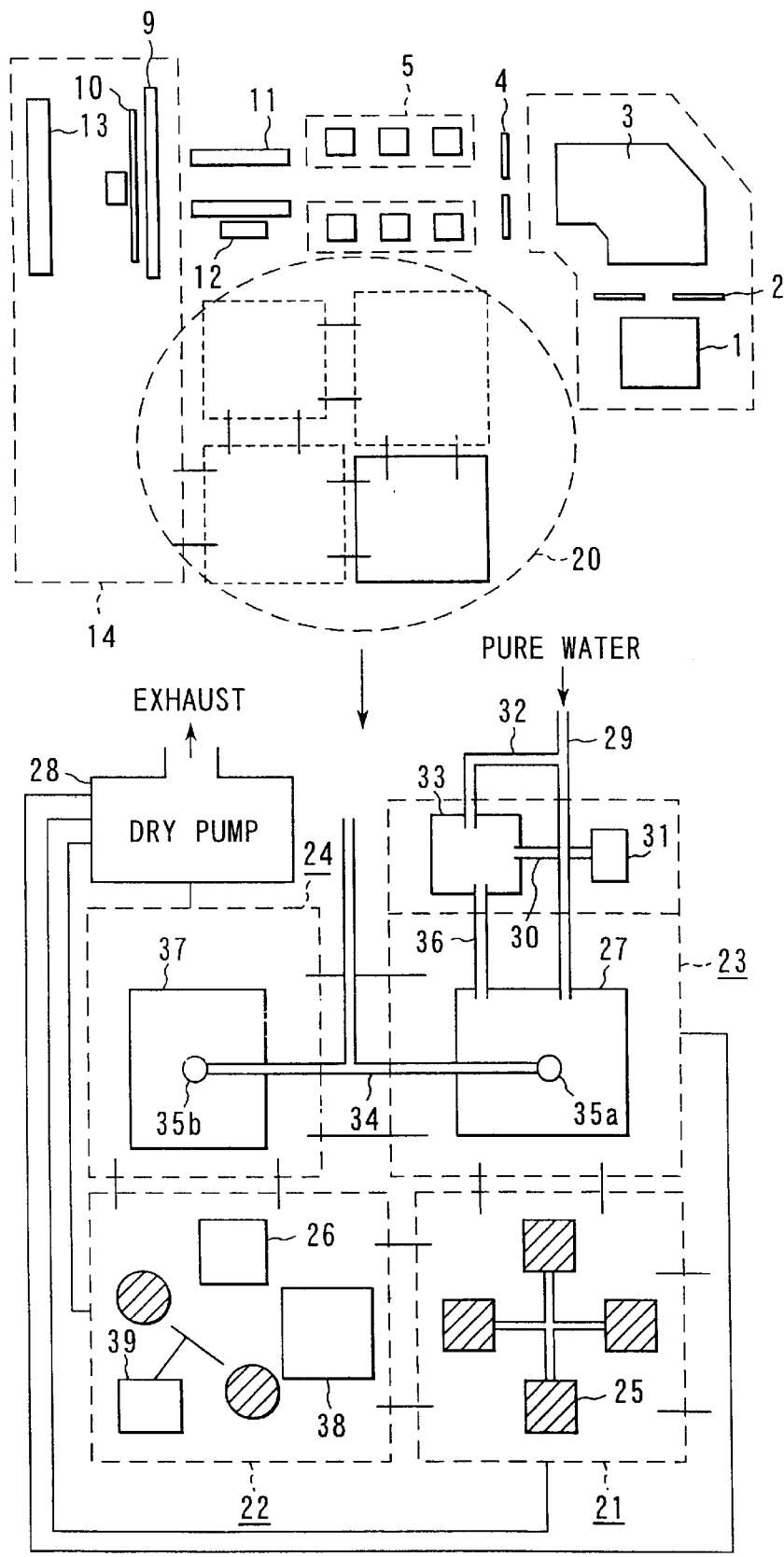
FIG. 4 is a schematic view showing an ion implantation equipment according to a second embodiment of this invention.

FIG. 4 is a schematic view showing an ion implantation equipment capable of effecting the ion implantation process without forming a natural oxide film again in a period from the end of the cleaning process to the ion implantation process. In FIG. 4, portions which correspond to those of FIG. 3 are denoted by the same reference numerals.

The ion implantation equipment is different from that of FIG. 3 in that an oxide film removing device 20 connected to a sample chamber 14, for removing an oxide film such as a natural oxide film or thermal oxide film formed on the surface of the sample is provided.

This invention can be applied to an ion implantation equipment which does not have an extraction electrode and includes only a post accelerator.

The oxide film removing device 20 is roughly divided into a preparation chamber 21 in which samples are prepared, a transferring chamber 22 having a mechanism for transferring the sample, a processing chamber 23 for pre-processing and removal of a natural oxide film, and a drying chamber 24 for drying the sample. The preparation chamber 21 and transferring chamber 22, the preparation chamber 21 and processing chamber 23, the processing chamber 23 and drying chamber 24, the drying chamber 24 and transferring chamber 22, and the transferring chamber 22 and sample chamber 14 are respectively connected to each other and the sample can be transferred between them.

Cassettes 25 made of Teflon (which are hereinafter simply referred to as cassettes) on which the samples are placed are provided in the preparing chamber 21. In FIG. 4, the four cassettes 25 are shown.

The samples and the cassettes 25 carrying them are transferred from the preparing chamber 21 into the processing chamber 23 by a transferring crane 26 and then placed in a quartz beaker 27 provided in the processing chamber 23.

At this time, the pressure in the transferring chamber 22 and processing chamber 23 is lowered to 0.1 Torr by a dry pump 28, after that they are raised to normal atmospheric pressure by $N_2$ purge gas. In this case, the partial pressure of oxygen (oxygen pressure/(oxygen pressure+nitrogen pressure)) in the transferring chamber 22 and processing chamber 23 is set equal to or less than 1 Torr. The transferring crane 27 can be moved in each of the chambers along a rail (not shown). As the transferring section, a member other than the crane can be used.

Next, pure water is supplied from a distributing water pipe 29 into the quartz beaker 27 to wash the samples and cassettes 25 carrying them for three minutes (pre-processing).

During the washing process, hydrofluoric acid in a chemical tank 31 is supplied into a washing chemical stirring chamber 33 via a hydrofluoric acid supply line 30 and pure water is supplied into the washing chemical stirring chamber 33 via a distributing water pipe 32 which is branched from the distributing water pipe 29 to make a mixture of 200 (pure water): 1 (hydrofluoric acid) and they are stirred in the washing chemical stirring chamber 33. At this time, a valve 35a of a water discharging pipe 34 is kept closed.

Then, after the valve 35a is opened to discharge pure water via the water discharging pipe 34, the valve 35a is closed. Next, a hydrofluoric acid mixed solution (dilute hydrofluoric acid solution) mixed in the ratio of 200 (pure water):1 (hydrofluoric acid) and prepared in the washing chemical stirring chamber 33 is supplied into the quartz beaker 27 via a chemical supply line 36.

In this case, a natural oxide film with a thickness of approx. 2 nm is formed on the surface of the sample, and in order to remove the natural oxide film, the samples and cassettes 25 are dipped in the hydrofluoric acid mixed solution in the quartz beaker 27 for washing for one minute.

Then, after the valve 35a is opened to discharge the hydrofluoric acid mixed solution via the water discharging pipe 34, the valve 35a is closed and pure water is supplied into the quartz beaker 27 via the distributing water pipe 29 to wash the samples and cassettes 25 for ten minutes.

After this, the valve 35a is opened to discharge pure water via the distributing water pipe 34 and the cassettes 25 carrying the samples are pulled up from the quartz beaker 27 by the transferring crane 26.

Next, the samples and the cassettes 25 carrying them are transferred into the dry chamber 24 by the transferring crane 26 under the $N_2$ atmosphere. A drying rinser 37 which is rotated at 100 rpm for drying is provided in the dry chamber 24 and the samples and cassettes 25 are dried by the drying rinser 37. The cassettes 25 is set on the drying rinser 37. The drying rinser 37 is rotated, at the same time the pressure in the dry chamber 24 is lowered to 0.1 Torr by the dry pump 28. The cassettes 25 is set on the drying rinser 37. Further, a valve 35b is opened to permit water of the samples and cassettes 25 to be discharged to the exterior via the water discharging pipe 34.

Then, the samples and the cassettes 25 carrying them are moved into the transferring chamber 22 by the transferring crane 26 and placed on a placing table 38. At this time, the pressure in the transferring chamber 22 is lowered to 0.1 Torr by the dry pump 28 beforehand.

Next, the samples are placed from the transferring chamber 23 to a wafer holder 8 by a transferring robot 39 under the reduced pressure condition. After this, ion is implanted into the sample under the reduced pressure condition like the conventional case or the first embodiment.

According to this embodiment, the sample is cleaned under the $N_2$ atmosphere, the natural oxide film formed on the surface thereof is removed, and the atmosphere is controlled in the reduced pressure condition from the start of drying the sample until the end of ion implantation so that a natural oxide film will not be formed on the surface of the sample again. Therefore, a reduction in the implantation amount can be effectively prevented.

Specifically, boron ion was implanted into the sample in a condition of the acceleration voltage 500 eV and dose amount $2\times10^{14}$ cm$^{-2}$ and the result was evaluated by SIMS, the count was 1.9 to $2\times10^{14}$ cm$^{-2}$ and thus a significant reduction in the implantation amount was not observed.

Since a lowering in the implantation amount can be thus effectively prevented, it is possible to implant ion into an extremely shallow region of 50 nm or less from the sample surface while suppressing an increase in a variation of implantation unlike the case where the sample is set in the ion implantation equipment by transferring the same at a normal atmospheric pressure.

Further, as will be described below, the natural oxide film on the surface of the sample also gives an influence to the concentration of boron after the heat treatment, that is, the concentration of active boron.

If boron ion is implanted into the sample in a condition of the acceleration voltage 500 eV and dose amount $2\times10^{14}$ cm$^{-2}$ by use of the conventional ion implantation equipment, the implantation amount is 1 to $1.5\times10^{14}$ cm$^{-2}$ and a lowering of 20% or more in the implantation amount can be observed. It is confirmed that the lowering in the implantation amount occurs if the acceleration voltage is 1 keV or less. The depth of the diffusion layer (junction depth) becomes shallower as the element is more miniaturized. In order to form the shallow diffusion layer, it is necessary to lower the acceleration voltage. However, in the case of low acceleration voltage, since the ion implantation amount is significantly lowered, it is difficult to form a shallow diffusion layer of desired concentration.

If the above sample is subjected to the heat treatment for 30 seconds at 900° C. in a nitrogen atmosphere by use of an RTA device, the count according to secondary-ion mass spectroscopy ("SIMS") becomes 5 to $7\times10^{13}$ cm$^{-2}$ and thus a further lowering in the boron concentration is observed.

The concentration of whole boron, that is, the concentration of inactive boron and active boron, is evaluated by SIMS. The concentration of active boron is evaluated by Hall measurements, and the result showed that the concentration was $2\times10^{13}$ cm$^{-2}$ and that a lowering in the concentration of active boron was significant.

On the other hand, in the case of the ion implantation equipment of this embodiment, even if the heat treatment was effected in the same condition, a lowering in the concentration of whole boron was not substantially observed and a lowering in the concentration of active boron was not substantially observed.

It is considered that this is because the surface condition of the sample at the time of ion implantation gives an influence. That is, in the conventional ion implantation equipment, it is considered that, since ion is implanted in a state in which the natural oxide film is formed on the surface of the sample, oxygen is knocked on from the natural oxide film at the time of ion implantation to create induced defects in the process of separation of oxygen at the time of heat treatment, activation of boron is obstructed by the induced defect and boron is diffused to the exterior together with oxygen.

Further, the film thickness of the natural oxide film is varied in the plane of the sample surface. This is considered a factor making it difficult to uniformly implant ion into the sample. A variation in the film thickness of the natural oxide film is 0.3 nm ±0.1 nm, for example.

This invention is not limited to the above embodiments. For example, in the above embodiments, ion implantation of boron is explained, but this invention can be applied to ion implantation of other impurity such as phosphorus.

Figure 5:
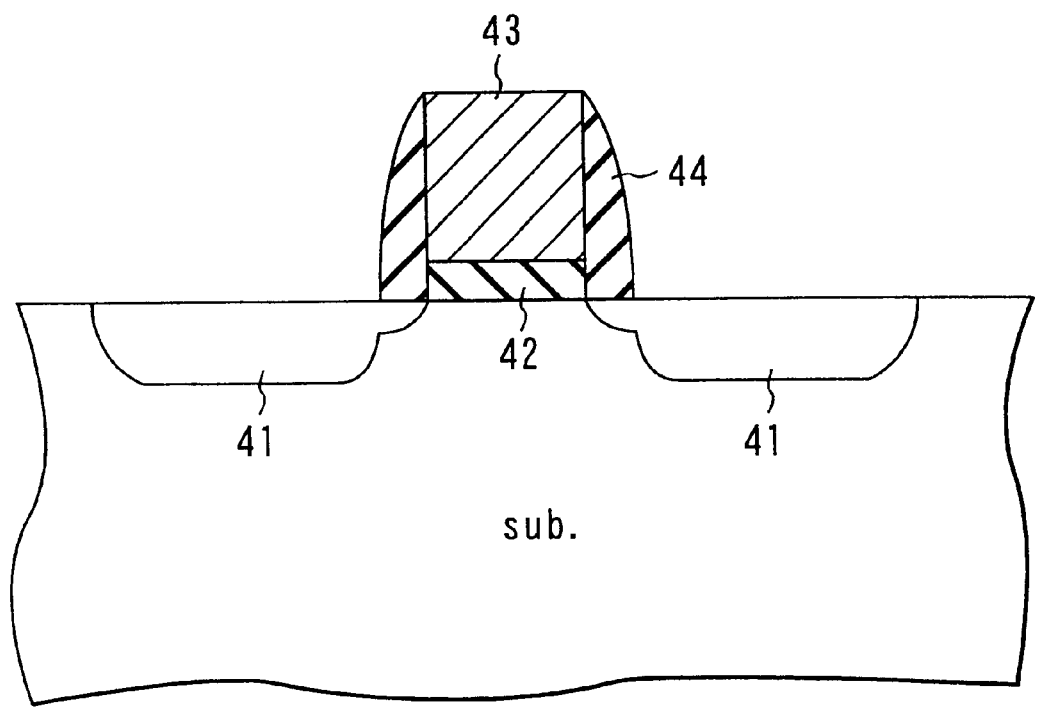
FIG. 5 is a cross sectional view showing one example of an object to which this invention can be applied.

Further, as an example of application of this invention, ion implantation for forming source/drain diffusion layers 41 having extension of a MOS transistor highly miniaturized as shown in FIG. 5 is given. Particularly, this invention is effective for the source/drain diffusion layer 41 whose depth is 30 nm or less and whose impurity concentration is low. In this case, it becomes possible to effectively suppress a variation in the contact resistance of the source/drain diffusion layer 41. In FIG. 5, a reference numeral 40 denotes an Si substrate, 42 denotes a gate insulating film (oxide film), 43 denotes a gate electrode, and 44 denotes a gate side wall insulating film (nitride film). It is preferable that the structure of the gate electrode 43 is formed of the polycide gate structure or metal gate structure.

In a case where the above source/drain diffusion layer is formed by ion implantation of boron, it is preferable to set the acceleration voltage to 200 eV to 500 eV and set the dose amount of boron ion to $2 \times 10^{13}$ cm$^{-2}$ at maximum. Further, if the diffusion layer is formed by ion implantation of arsenic, it is preferable to set the acceleration voltage to 3 keV or less and set the dose amount of arsenic ion to $2 \times 10^{13}$ cm$^{-2}$ at maximum.

This invention can also be applied to ion implantation for adjusting the threshold voltage of a MOS transistor. In this case, a variation in the threshold voltage (Vth) can be effectively suppressed.

Further, the ion implantation equipment of this invention is not limited to the construction explained in the second embodiment and any construction can be used if an oxide film is not formed again in a period from start of removal of the oxide film to the end of the ion implantation process.

As the sample, a normal Si substrate (Si wafer), SOI substrate (SOI wafer), or another semiconductor substrate (semiconductor wafer) formed of SiGe or the like may be used.

In addition, this invention can be variously modified without departing from the technical scope thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ion implantation equipment comprising:

an ion implantation equipment main body for implanting desired type of ion into a sample; and an oxide film removing device in which a cleaning chamber, a drying chamber and a transferring section are provided, the cleaning chamber removing an oxide film formed on the surface of the sample by wet etching before implanting the desired type of ion into the sample, the drying chamber drying the sample cleaned in said cleaning chamber and connected to said cleaning chamber, the transferring section transferring the sample into said ion implantation equipment main body and connected to said drying chamber and said ion implantation equipment main body.

2. The ion implantation equipment according to claim 1, wherein said ion implantation equipment main body includes a container for generating plural types of ions therein; a first electrode for extracting the plural types of ions from said container; a selector section for selecting at least one desired type of ion from the plural types of ions; a second electrode for accelerating the desired type of ion; a sample chamber for placing a sample into which the accelerated ion is implanted.

3. The ion implantation equipment according to claim 2, wherein said first electrode extracts the plural types of ions from said container and accelerates the plural types of ions.

4. The ion implantation equipment according to claim 3, wherein said oxide film removing device includes a pressure control section for controlling the pressures in said sample chamber, cleaning chamber and drying chamber.

* * * * *